(12) United States Patent
Kokatsu

(10) Patent No.: US 11,508,686 B2
(45) Date of Patent: Nov. 22, 2022

(54) SEMICONDUCTOR DEVICE, RECEIVER AND TRANSMITTER

(71) Applicant: THINE ELECTRONICS, INC., Tokyo (JP)

(72) Inventor: Hideyuki Kokatsu, Tokyo (JP)

(73) Assignee: THINE ELECTRONICS, INC., Tokyo (JP)

(*) Notice: Subject to any disclaimer, the term of this patent is extended or adjusted under 35 U.S.C. 154(b) by 11 days.

(21) Appl. No.: 17/171,331

(22) Filed: Feb. 9, 2021

(65) Prior Publication Data

US 2021/0257328 A1    Aug. 19, 2021

(30) Foreign Application Priority Data

Feb. 13, 2020  (JP) .............................. JP2020-022429

(51) Int. Cl.
| | |
|---|---|
| *H01L 23/00* | (2006.01) |
| *H01L 27/02* | (2006.01) |
| *H01L 49/02* | (2006.01) |
| *H01L 25/065* | (2006.01) |

(52) U.S. Cl.
CPC .............. *H01L 24/48* (2013.01); *H01L 24/05* (2013.01); *H01L 27/0248* (2013.01); *H01L 28/20* (2013.01); *H01L 25/0652* (2013.01); *H01L 2224/04042* (2013.01); *H01L 2224/48147* (2013.01); *H01L 2924/30107* (2013.01)

(58) Field of Classification Search
CPC ...... H01L 27/0248; H01L 28/20; H01L 23/60
See application file for complete search history.

(56) References Cited

U.S. PATENT DOCUMENTS

| | | | | |
|---|---|---|---|---|
| 5,386,127 | A | * | 1/1995 | Furuyama ............ G11C 29/006 257/786 |
| 8,427,799 | B2 | | 4/2013 | Collura et al. |
| 9,570,446 | B1 | * | 2/2017 | Woo ........................ H01L 24/09 |
| 11,011,612 | B2 | * | 5/2021 | Umemoto ............... H01L 29/78 |
| 2001/0015490 | A1 | | 8/2001 | Lee |
| 2009/0115041 | A1 | * | 5/2009 | Igarashi .................. H01L 23/66 257/679 |

(Continued)

FOREIGN PATENT DOCUMENTS

JP    2015100034 A  *  5/2015

OTHER PUBLICATIONS

Full NPL STIC search attached (Year: 2014).*

(Continued)

*Primary Examiner* — Mamadou L Diallo
(74) *Attorney, Agent, or Firm* — Sughrue Mion, PLLC

(57) ABSTRACT

A semiconductor device includes a semiconductor chip and a package. The semiconductor chip includes a signal processing circuit, a plurality of pads, and a first resistor which are formed on a semiconductor substrate. On the semiconductor chip, there is no shot-circuiting between a first pad and a second pad of the plurality of pads. A signal input terminal of the signal processing circuit is connected to the second pad. The first resistor is provided between a reference potential supply terminal for supplying a power supply potential and the first pad. A specific terminal of the plurality of terminals of the package is connected to the first pad by a first bonding wire, and is connected to the second pad by a second bonding wire.

16 Claims, 16 Drawing Sheets

(56) References Cited

U.S. PATENT DOCUMENTS

| | | | |
|---|---|---|---|
| 2010/0109053 A1* | 5/2010 | Jan | H01L 23/60 |
| | | | 257/E21.531 |
| 2010/0253435 A1 | 10/2010 | Ichitsubo et al. | |
| 2011/0187302 A1* | 8/2011 | Sugie | H01L 23/50 |
| | | | 318/400.29 |
| 2015/0188422 A1* | 7/2015 | Kokatsu | H02M 3/156 |
| | | | 323/290 |
| 2015/0271914 A1* | 9/2015 | Lai | H01L 23/647 |
| | | | 361/767 |
| 2017/0062322 A1* | 3/2017 | Sakata | H01L 24/49 |
| 2018/0019192 A1* | 1/2018 | Chen | H01L 24/17 |
| 2020/0072891 A1* | 3/2020 | Henmi | G01R 31/70 |

OTHER PUBLICATIONS

"What-When-How in Depth Tutorials and Information Circuit Design (GPS) Part 9", http://what-when-how.com/gps-galileo-dual-rf-front-end-receiver-and-design-fabrication-and-test/circuit-design-gps-part, Feb. 13, 2020, pp. 1-9 (9 pages total).

* cited by examiner

SEMICONDUCTOR DEVICE, RECEIVER AND TRANSMITTER

TECHNICAL FIELD

The present invention relates to a semiconductor device, a receiver and a transmitter.

BACKGROUND

A semiconductor device is generally configured by mounting a semiconductor chip having a signal processing circuit consisting of many elements such as transistors and a plurality of pads in a package having terminals for inputting a signal from or outputting a signal to the outside, and connecting the pads of the semiconductor chip to the terminals of the package by bonding wires each having a small diameter and made of gold or copper.

A bonding wire has a parasitic inductance. For example, as a typical example of the bonding; wire, when a wire length is 1 mm and a wire diameter is 0.015 mm, the parasitic inductance of the bonding wire is about 0.92 nH. When a frequency of a signal is 10 GHz, an absolute value of an impedance of the bonding wire is 57.8Ω ($=2\pi\times10$ GHz$\times$0.92 nH). Further, a characteristic impedance of a signal transmission line connected to the terminal of the package is, for example, 50Ω.

As shown in this example, the absolute value of the impedance of the bonding wire (57.8Ω) is not negligible with respect to the characteristic impedance (50Ω) of the signal transmission line, and causes deterioration in performance of, signal processing by the signal, processing circuit on the semiconductor chip. As the frequency, of the signal processed by the signal processing circuit becomes higher, the performance of signal processing is more easily affected by the parasitic inductance of the bonding wire.

Several techniques for dealing with a problem of the parasitic inductance of a bonding wire are known (Patent Literature 1 to 3 and Non-Patent Literature 1). Further, a package (for example, a wafer level chip size package (WCSP)) in which the pads and the terminals of the semiconductor chip can be electrically connected to each other without using bonding wires is also known.

[Patent Literature 1] U.S. Patent Application Publication No. 2010/0253435

[Patent Literature 2] U.S. Pat. No. 8,427,799

[Patent Literature 3] U.S. Patent Application Publication No. 2001/0015490

[Non-Patent Literature 1] "What-when-how. In Depth Tutorials and Information, Circuit Design (GPS) Part 9", [online], [retrieved Feb. 13, 2020], Internet <URL:http://what-when-how.com/gps-galileo-dual-rf-front-end-receiver-and-design-fabrication-and-test/circuit-design-gps-part-9/>

SUMMARY

However, in the related art, an influence of the parasitic inductance of a bonding wire in high-speed signal transmission has not been able to be sufficiently reduced. Further, a package provided with a semiconductor chip without using bonding wires is expensive and requires advanced mounting technology.

The present invention has been made to solve the above-described problems, and an object thereof is to provide a semiconductor device capable of reducing an influence of a parasitic inductance of a bonding wire.

A semiconductor device of the present invention includes (1) a semiconductor chip including a signal processing circuit, a plurality of pads, and a first resistor, and (2) a package provided with the semiconductor chip, the package including terminals or inputting a signal from or outputting a signal to outside, wherein there is no short-circuiting between a first pad and a second pad of the plurality of pads, the first resistor is provided between the first pad and a reference potential supply terminal, and the second pad is connected to a signal input terminal or a signal output terminal of the signal processing circuit, and wherein a specific terminal among the terminals of the package is connected to the first pad by a first bonding wire and is connected to the second pad by a second bonding wire. The semiconductor chip may include a second resistor provided between the second pad and the reference potential supply terminal. The semiconductor chip may include a third resistor provided between the first pad and the second pad, A semiconductor device of the present invention includes (1) a semiconductor chip including a signal processing circuit, and a plurality of pads, and (2) a package provided with the semiconductor chip, the package including terminals for inputting, a signal from or outputting a signal to outside, wherein there is no short-circuiting, between a first pad and a second pad of the plurality of pads, and the second pad is connected to a signal input terminal of the signal processing circuit, and wherein a specific terminal among the terminals of the package is connected to the first pad by a first bonding wire and is connected to the second pad by a second bonding wire. A receiver of the present invention includes the semiconductor device, and a fourth resistor provided between the specific terminal of the package and the reference potential supply terminal.

A semiconductor device of the present invention includes (1) a semiconductor chip including a signal processing circuit, and a plurality of pads, and (2) a package provided with the semiconductor chip, the package including terminals for inputting a signal from or outputting a signal to outside, wherein there is no short-circuiting between a first pad and a second pad of the plurality of pads, and the second pad is connected to a signal output terminals of the signal processing circuit, and wherein a specific terminal among the terminals of the package is connected to the first pad by a first bonding, wire and is connected to the second pad by a second bonding wire. A transmitter of the present invention includes the semiconductor device, and a fifth resistor provided between the specific terminal of the package and the reference potential supply terminal.

In the semiconductor device of the present invention, the semiconductor chip has an electrostatic discharge (ESD) protection device connected to the first pad.

According to the present invention, it is possible to reduce an influence of a parasitic inductance of a bonding wire.

DETAILED DESCRIPTION

Figure 1:
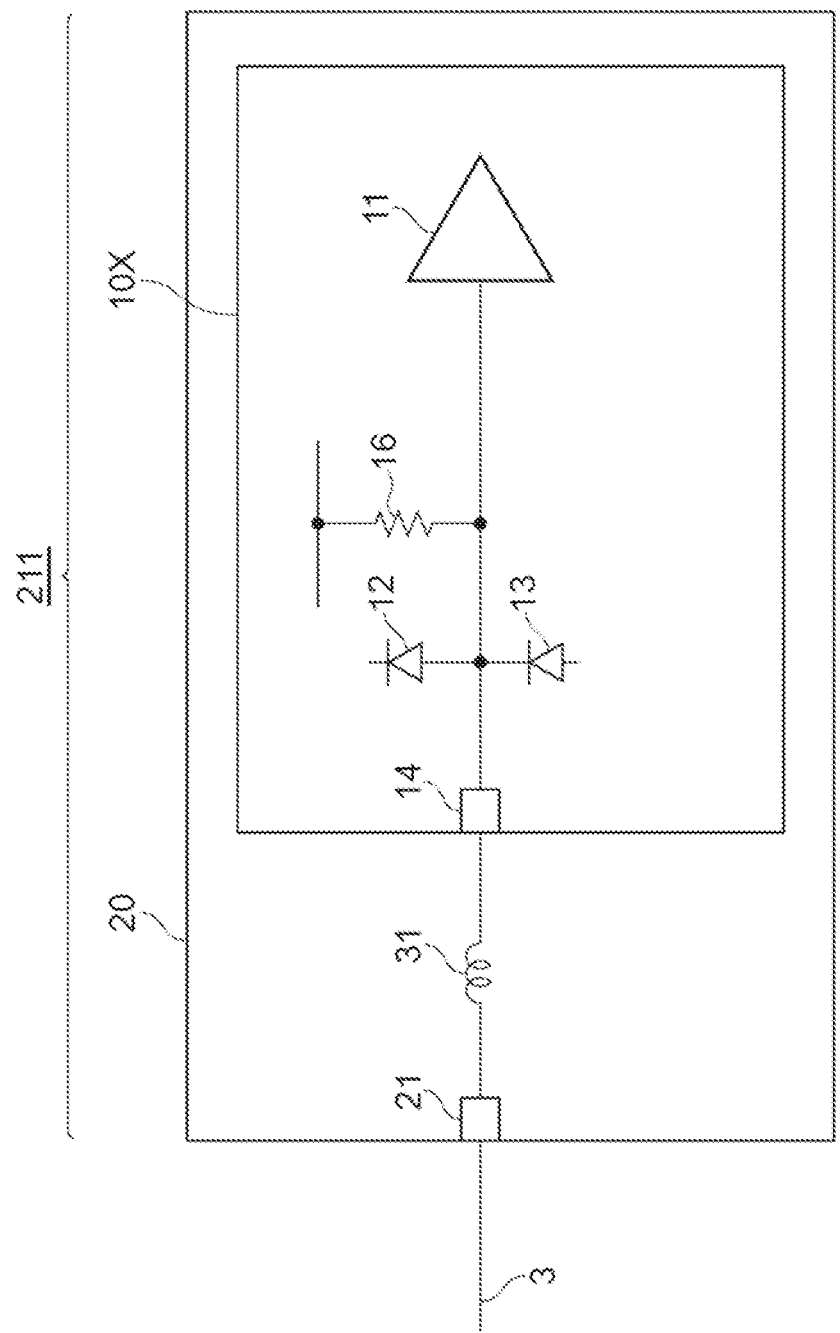
FIG. 1 is a diagram showing a configuration of a semiconductor device 211 of a first comparative example.

Hereinafter, embodiments for carrying out the present invention will be described in detail with reference to the accompanying drawings. In the description of the drawings, the same elements are designated by the same reference numerals, and duplicate description thereof will be omitted. The present invention is not limited to these examples, is indicated by the scope of claims, and is intended to include all modifications within the meaning and scope equivalent to the scope of claims.

Hereinafter, configurations of the embodiments will be described after a configuration of a comparative example is described. In addition, two aspects will be described in each of the comparative examples and each of the embodiments. One aspect has a feature on die signal input side of a semiconductor chip, and the other aspect has a feature on the signal output side of the semiconductor chip.

FIRST COMPARATIVE EXAMPLE

FIG. 1 is a diagram showing a configuration of a semiconductor device 211 of a first comparative example. The semiconductor device 211 includes a semiconductor chip 10X and a package 20, and receives a signal transmitted through a signal transmission line 3.

The semiconductor chip 10X includes a signal processing circuit 11, ESD protection devices 12 and 13, a plurality of pads, and a resistor 16 which are formed in or on a semiconductor substrate. The signal processing circuit 11 is configured of a large number of devices such as transistors. A type of the signal processing circuit 11 is arbitrary. The signal processing circuit 11 is, for example, a logic circuit, a high frequency differential amplifier, a low noise amplifier, or the like. A signal input terminal of the signal processing circuit 11 is connected to one pad 14 of the plurality of pads.

The ESD protection devices 12 and 13 are provided to protect the signal processing circuit 11 from a surge voltage such as static electricity entering from the outside and to prevent the signal processing circuit 11 from malfunctioning, and are, for example, diodes. One ESD protection device 12 is provided between a reference potential supply terminal for supplying a power supply potential and the pad 14. The other ESD protection device 13 is provided between a reference potential supply terminal for supplying a ground potential and the pad 14. The resistor 16 is provided between the reference potential supply terminal for supplying a power supply potential and the pad 14.

The package 20 is provided with a semiconductor chip 10X and has terminals for inputting a signal from or outputting a signal to the outside. One terminal 21 of the terminals is connected to the pad 14 by a bonding wire 31. Further, the terminal 21 is connected to the signal transmission line 3. Various types of packages are known, but the type of the package 20 is arbitrary as long as the connection between the pad and the terminal of the semiconductor chip is made by a bonding wire.

The signal transmitted through the signal transmission line 3 and reaching the terminal 21 of the package 20 is input to the signal input terminal of the signal processing circuit 11 via the terminal 21, the bonding wire 31 and the pad 14. The resistor 16 has a resistance value similar to a characteristic impedance of the signal transmission line 3. Even when a surge voltage such as static electricity is input to the terminal 21, the signal processing circuit 11 is protected and a malfunction of the signal processing circuit 11 is prevented by providing the ESD protection devices 12 and 13.

As described above, as an example, a frequency of the signal is 10 GHz, an absolute value of the impedance of the bonding wire is 57.8Ω, the characteristic impedance of the signal transmission line 3 is 50Ω, and the resistance value of the resistor 16 is 50Ω. The absolute value of the impedance of the bonding wire 31 is not negligible with respect to the characteristic impedance of the signal transmission line 3, and causes deterioration in performance of signal processing by the signal processing circuit 11. As the frequency of the signal processed by the signal processing circuit 11 becomes higher, the performance of the signal processing is more easily affected by a parasitic inductance of the bonding wire 31.

Figure 2:
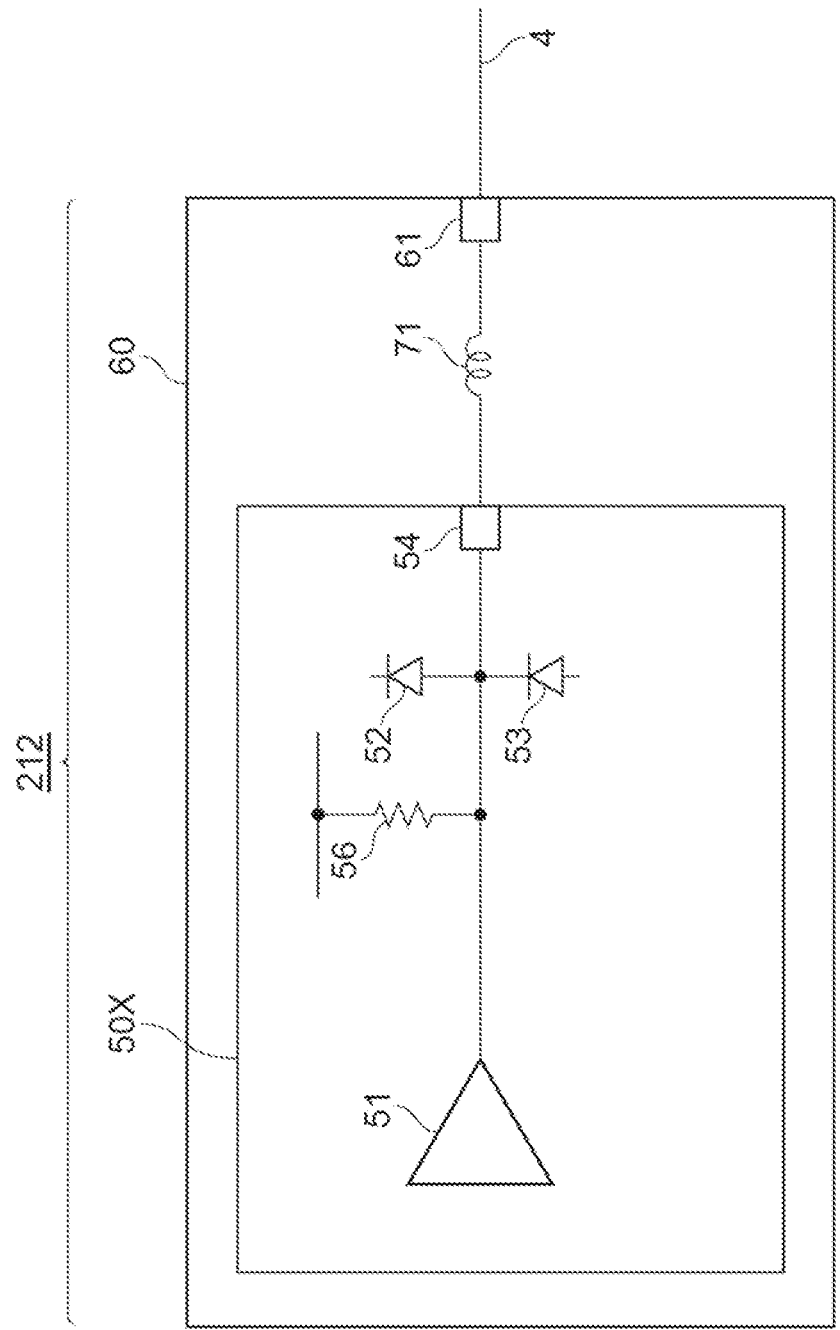
FIG. 2 is a diagram showing a configuration of a semiconductor device 212 of the first comparative example.

FIG. 2 is a diagram showing a configuration of a semiconductor device 212 of the First comparative example. The semiconductor device 212 includes a semiconductor chip 50X and a package 60, and transmits a signal to a signal transmission line 4.

The semiconductor chip 50X has a signal processing circuit 51, ESD protection devices 52 and 53, a plurality of pads, and a resistor 56 which are formed in or on a semiconductor substrate. The signal processing circuit 51 is configured of a large number of devices such as transistors. A type of the signal processing circuit 51 is arbitrary. The signal processing circuit 51 is, for example, a logic circuit, a high frequency differential amplifier, a low noise amplifier, or the like. A signal output terminal of the signal processing circuit 51 is connected to one pad 54 of the plurality of pads.

The ESD protection devices 52 and 53 are provided to protect the signal processing circuit 51 from a surge voltage such as static electricity entering from the outside and to prevent the signal processing circuit 51 from malfunctioning, and are, for example, diodes. One ESD protection device 52 is provided between a reference potential supply terminal for supplying a power supply potential and the pad 54. The other ESD protection device 53 is provided between a reference potential supply terminal for supplying a ground potential and the pad 54. The resistor 56 is provided between the reference potential supply terminal for supplying a power supply potential and the pad 54.

The package 60 is equipped with a semiconductor chip 50X and has terminals for inputting a signal from or outputting a signal to the outside. A terminal 61 of the terminals is connected to the pad 54 by a bonding wire 71. Further, the terminal 61 is connected to the signal transmission line 4. Various types of packages are know n, but the type of the package 60 is arbitrary as long as the connection between the pad and the terminal of the semiconductor chip is made by a bonding wire.

The signal output from the signal output terminal of the signal processing circuit 51 is transmitted to the signal transmission line 4 via the pad 54, the bonding wire 71, and the terminal 61. The resistor 56 has a resistance value similar to a characteristic impedance of the signal transmission line 4. Even when a surge voltage such as static electricity is input to the terminal 61, the signal processing circuit 51 is protected and a malfunction of the signal processing circuit 51 is prevented by providing the ESD protection devices 52 and 53.

This semiconductor device 212 also has the same problem as that of the semiconductor device 211. That is, an absolute value of the impedance of the bonding wire 71 is so large that it cannot be ignored with respect to the characteristic impedance of the signal transmission line 4, and causes deterioration in performance of signal processing by the signal processing circuit 51. As the frequency of the signal processed by die signal processing circuit 51 becomes higher, the performance of the signal processing is more easily affected by the parasitic inductance of the bonding wire 71.

SECOND COMPARATIVE EXAMPLE

Figure 3:
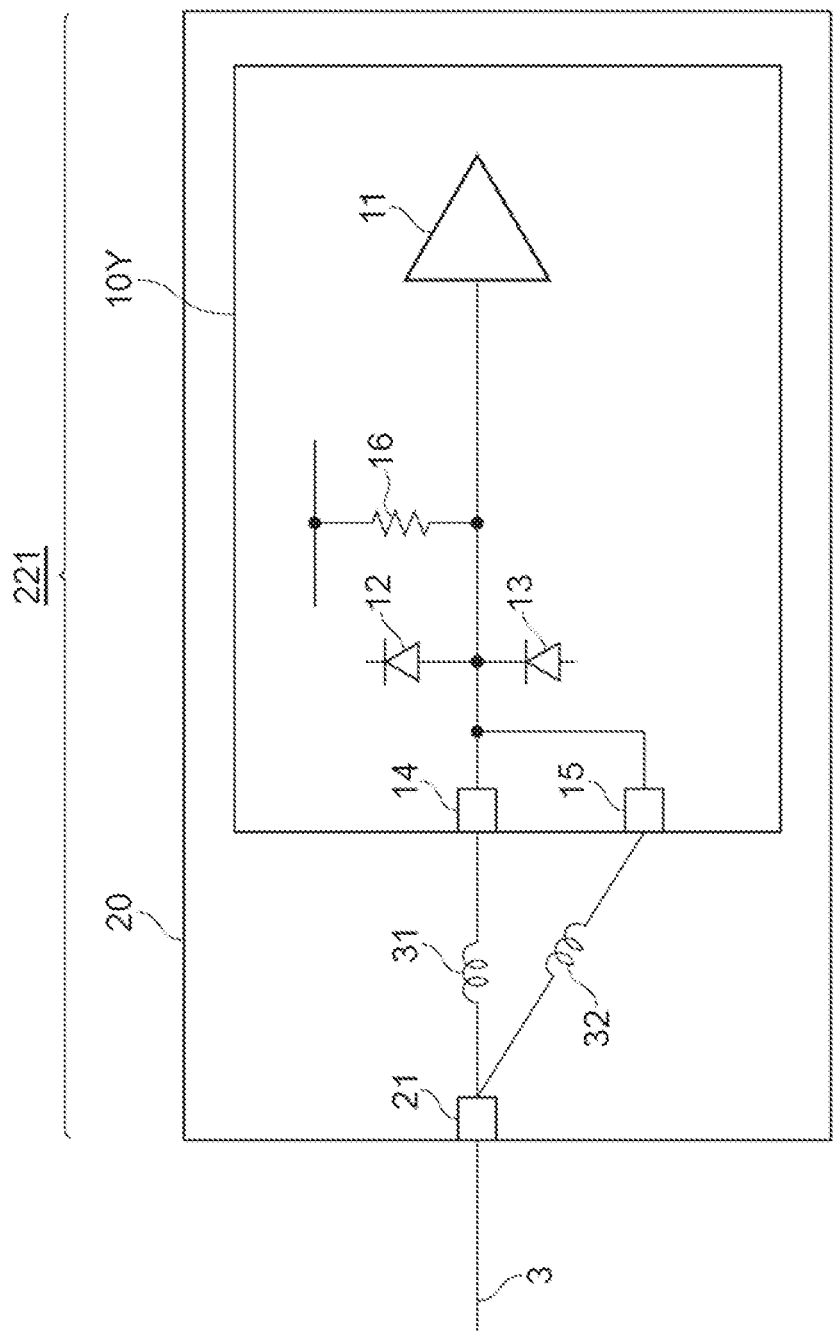
FIG. 3 is a diagram showing a configuration of a semiconductor device 221 of a second comparative example.

FIG. 3 is a diagram showing a configuration of a semiconductor device 221 of a second comparative example. The semiconductor device 221 includes a semiconductor chip 10Y and a package 20, and receives a signal transmitted through a signal transmission line 3. When compared with the configuration of the semiconductor device 211 of the first comparative example (FIG. 1), the configuration (FIG. 3) of the semiconductor device 221 of the second comparative example is different in that the signal input terminal of the signal processing circuit 11 is connected to two pads 14 and 15. The pad 14 and the pad 15 are short-circuited on the semiconductor chip 10Y. The terminal 21 of the package 20 is connected to the pad 14 by the bonding wire 31, and is connected to the pad 15 by the bonding wire 32.

Figure 4:
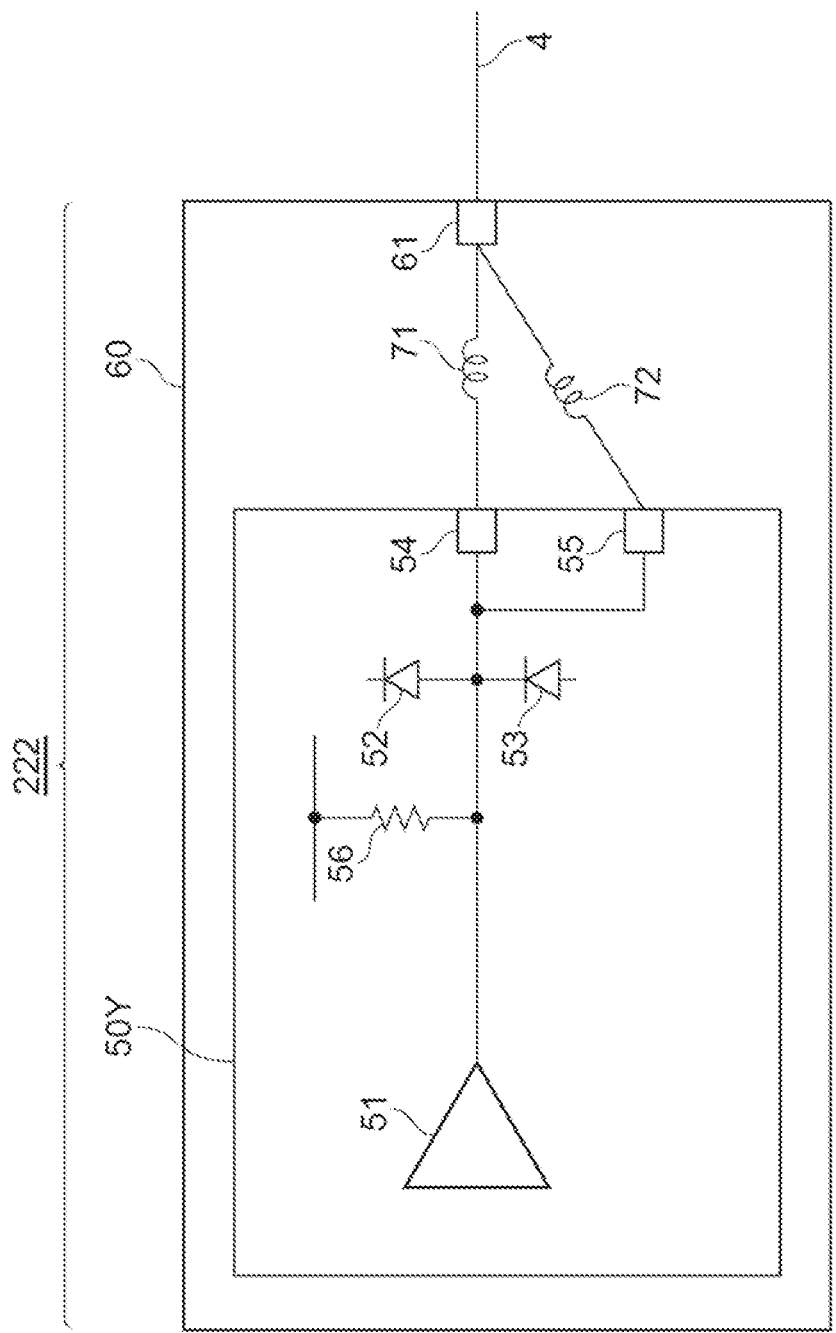
FIG. 4 is a diagram showing a configuration of a semiconductor device 222 of the second comparative example.

FIG. 4 is a diagram showing a configuration of a semiconductor device 222 of the second comparative example. The semiconductor device 222 includes a semiconductor chip 50Y and a package 60, and transmits a signal to the signal transmission line 4. When compared with the configuration of the semiconductor device 212 of the first comparative example (FIG. 2), the configuration (FIG. 4) of the semiconductor device 222 of the second comparative example is different in that the signal output terminal of the signal processing circuit 51 is connected to two pads 54 and 55. The pad 54 and the pad 55 are short-circuited on the semiconductor chip 50Y. The terminal 61 of the package 60 is connected to the pad 54 by the bonding wire 71, and is connected to the pad 55 by the bonding wire 72.

In the second comparative example, the signal input terminal or the signal output terminal of the signal processing circuit on the semiconductor chip is connected to two pads, and these two pads are connected to one terminal of the package. That is, the signal input terminal or signal output terminal of the signal processing circuit and one terminal of the package are connected by two bonding wires provided in parallel. Thus, in the second comparative example as compared with the first comparative example, the influence of the parasitic inductance caused by the bonding wire can be reduced. However, the reduction of the influence of the parasitic inductance of the bonding wire is not sufficient.

First Embodiment

Figure 5:
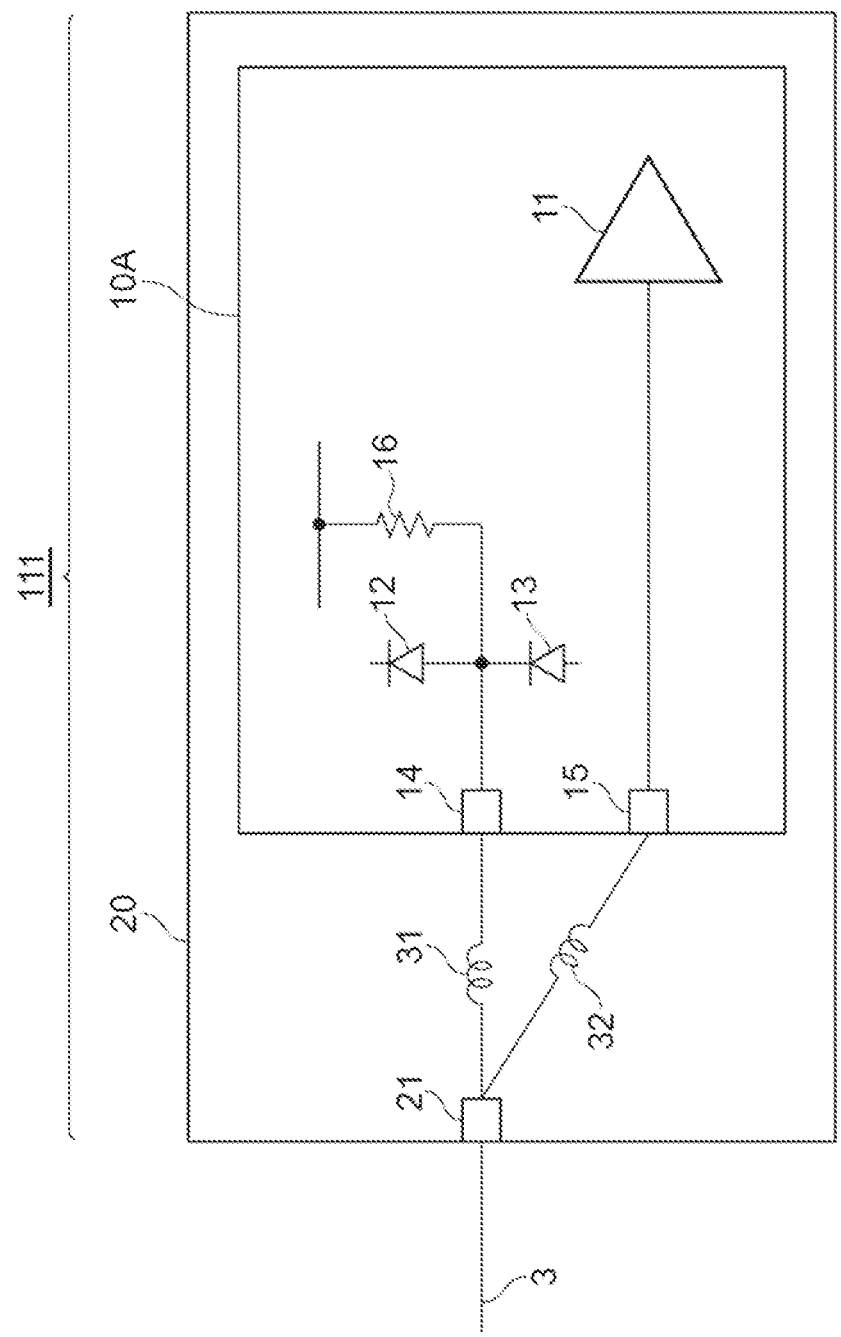
FIG. 5 is a diagram showing a configuration of a semiconductor device 111 of a first embodiment.

FIG. 5 is a diagram showing a configuration of a semiconductor device 111 of a first embodiment. The semiconductor device 111 includes a semiconductor chip 10A and a package 20, and receives a signal transmitted through a signal transmission line 3.

The semiconductor chip 10A includes a signal processing circuit 11, ESD protection devices 12 and 13, a plurality of pads, and a first resistor 16 which are formed in or on a semiconductor substrate. On the semiconductor chip 10A, there is no short-circuiting between a first pad 14 and a second pad 15 of die plurality of pads. The signal input terminal of the signal processing circuit 11 is connected to the second pad 15. The ESD protection device 12 is provided between a reference potential supply terminal for supplying a power supply potential and the first pad 14. The ESD protection device 13 is provided between a reference potential supply terminal for supplying a ground potential and the first pad 14. The first resistor 16 is provided between the reference potential supply terminal for supplying a power supply potential and the first pad 14.

The package 20 is provided with the semiconductor chip 10A and has terminals for inputting a signal from or outputting a signal to the outside. A specific terminal 21 of the terminals is connected to the first pad 14 by a first bonding wire 31, and is connected to the second pad 15 by a second bonding wire 32. Further, the terminal 21 is connected to the signal transmission line 3.

The signal transmitted through the signal transmission line 3 and reaching the terminal 21 of the package 20 is input to the signal input terminal of the signal processing circuit 11 via the terminal 21, the second bonding wire 32, and the second pad 15. An input impedance of the signal processing circuit 11 is generally sufficiently larger than a characteristic impedance of a system (for example, 50Ω). Therefore, the signal which has reached the terminal 21 is directly transmitted to the signal input terminal of the signal processing circuit 11. The first resistor 16 is connected to the signal transmission line 3 via the first pad 14, the first bonding wire 31 and the terminal 21, and has a resistance value similar to a characteristic impedance of the signal transmission line 3. Even when a surge voltage such as static electricity is input to the terminal 21, the signal processing circuit 11 is protected and the malfunction of the signal processing circuit 11 is prevented by providing the ESD protection devices 12 and 13. The ESD protection devices 12 and 13 may not be provided.

Figure 6:
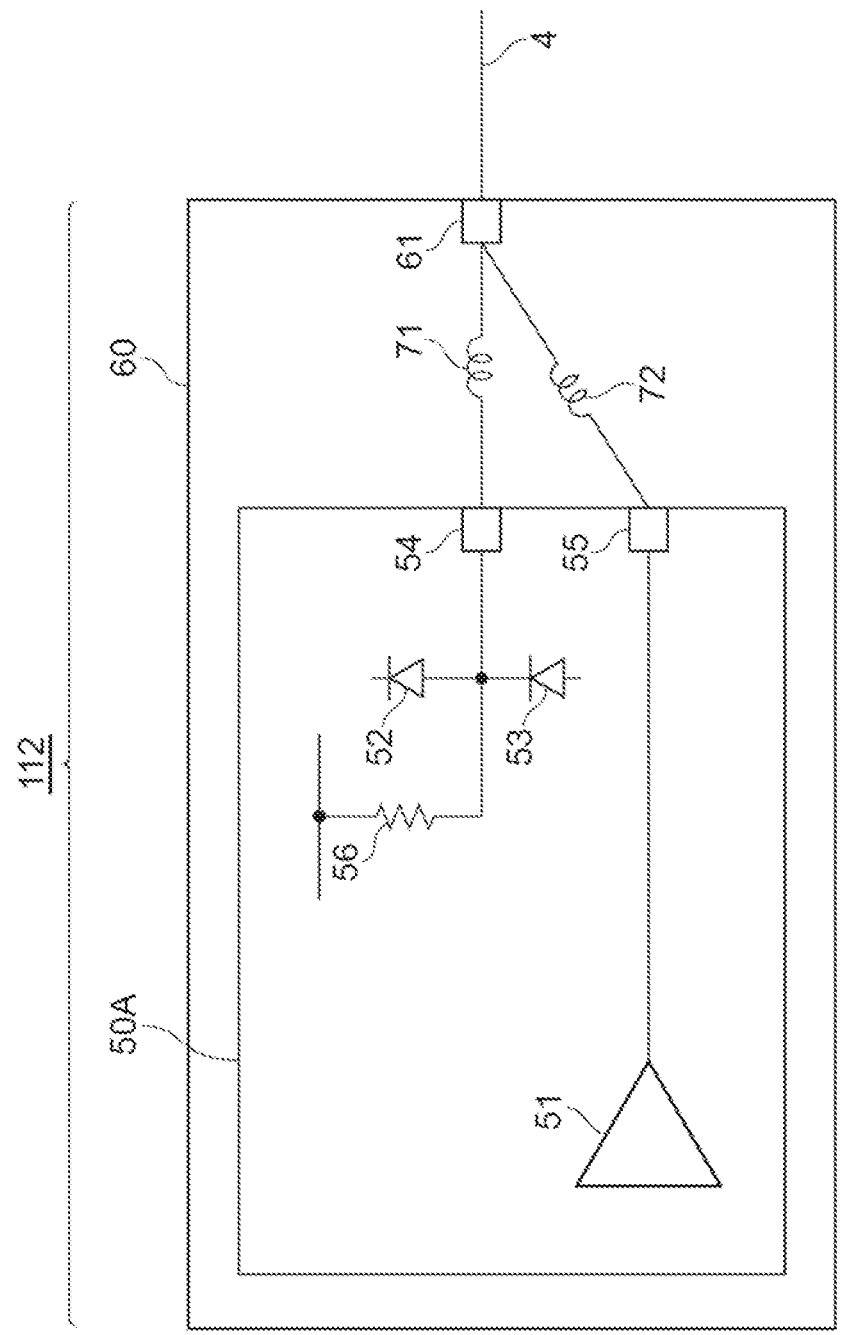
FIG. 6 is a diagram showing a configuration of a semiconductor device 112 of the first embodiment.

FIG. 6 is a diagram showing a configuration of a semiconductor device 112 of the first embodiment. The semiconductor device 112 includes a semiconductor chip 50A and a package 60, and transmits a signal to a signal transmission line 4.

The semiconductor chip 50A includes a signal processing circuit 51, ESD protection devices 52 and 53, a plurality of pads, and a first resistor 56 which are formed in or on a semiconductor substrate. On the semiconductor chip 50A, there is no short-circuiting between a first pad 54 and a second pad 55 of the plurality of pads. A signal output terminal of the signal processing circuit 51 is connected to the second pad 55. The ESD protection device 52 is provided between the reference potential supply terminal tor supplying a power supply potential and the first pad 54. The ESD protection device 53 is provided between the reference potential supply terminal for supplying a ground potential and the first pad 54. The first resistor 56 is provided between the reference potential supply terminal for supplying a power supply potential and the first pad 54.

The package 60 is provided with the semiconductor chip 50A and has terminals for inputting a signal from or outputting a signal from the outside. One terminal 61 of the terminals is connected to the first pad 54 by a first bonding wire 71, and is connected to the second pad 55 by a second bonding wire 72. Further, the terminal 61 is connected to the signal transmission line 4.

The signal output from the signal output terminal of the signal processing circuit 51 is transmitted to the signal transmission line 4 via the second pad 55, the second bonding wire 72, and the terminal 61. The first resistor 56 has a resistance value similar to a characteristic impedance of the signal transmission line 4. Even when a surge voltage such as static electricity is input to the terminal 61, the signal processing circuit 51 is protected and a malfunction of the signal processing circuit 51 is prevented by providing the ESD protection devices 52 and 53. The ESD protection devices 52 and 53 may not be provided.

In the first embodiment (FIGS. 5 and 6), on the semiconductor chip, the signal input terminal or the signal output terminal of the signal processing circuit is connected to the second pad, and the first resistor is connected to the first pad. There is no short-circuiting between the first pad and the second pad. One terminal of the package is connected to the first pad by the first bonding wire and is connected to the second pad by the second bonding wire.

Figure 7:
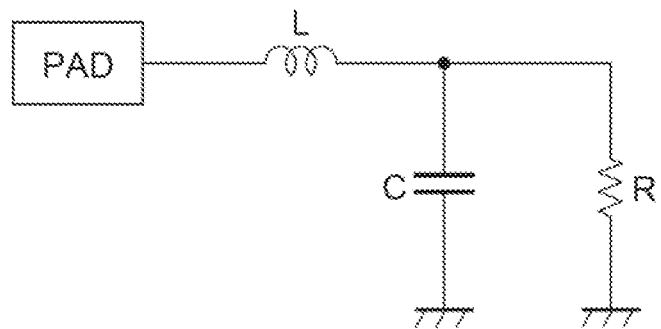
FIG. 7 is a diagram showing an equivalent circuit.

In this case, a circuit portion including the first bonding wire, the second bonding wire, the first pad, the second pad, the first resistor, and the ESD protection device is represented by an equivalent circuit as shown in FIG. 7. A combined impedance Z of the equivalent circuit is represented by the following Equation (1). L is an inductance value of the bonding wire, C is a capacitance value between the pad or the like and the ground potential, R is a resistance value of the first resistor, and s is an s space operator in the Laplace transform.

Equation (1)

$$Z = sL + \frac{1}{\frac{1}{R} + sC} = sL + \frac{R}{1+sRC} = \frac{R}{1+sRC}\left(1 + s\frac{L}{R} + s^2 LC\right) \quad (1)$$

In Equation (1), when s is replaced with $j\omega$ and represented by an angular frequency $\omega$, the combined impedance Z is represented by the following Equation (2). j is an imaginary unit Equation (2)

$$Z = \frac{R}{1+j\omega RC}\left\{1 + j\omega\frac{L}{R} - \omega^2 LC\right\} \quad (2)$$

$$= \frac{R}{1+(\omega RC)^2}\left\{1 - \omega^2 LC + j\omega\frac{L}{R}\right\}(1 - j\omega RC)$$

$$= \frac{R}{1+(\omega RC)^2}\left\{1 + j\omega\left[\frac{L}{R} - RC + \frac{L}{R}(\omega RC)^2\right]\right\}$$

An absolute value of the combined impedance Z is represented by the following Equation (3).

Equation (3)

$$|Z| = \frac{R}{1+(\omega RC)^2}\sqrt{1 + \omega^2\left[\frac{L}{R} - RC + \frac{L}{R}(\omega RC)^2\right]^2} \quad (3)$$

Since a value of $\omega RC$ may be sufficiently smaller than 1, Equation (3) can be approximated by the following Equation (4).

Equation (4)

$$|Z| = R\sqrt{1 + \omega^2\left(\frac{L}{R} - RC\right)^2} \quad (4)$$

As can be seen from Equation (4), when $L=R^2 C$, the combined impedance Z becomes equal to R. Alternatively, when L is set to a value close to $R^2 C$, the combined impedance Z becomes a value close to R. Each of values of L, R and C may be set appropriately. For example, when L=1 nH and R=50Ω, C=400 fF may be set, or C may be set to a value close to 400 fF. Accordingly, the influence of the parasitic inductance of the bonding wire can be reduced.

Second Embodiment

Figure 8:
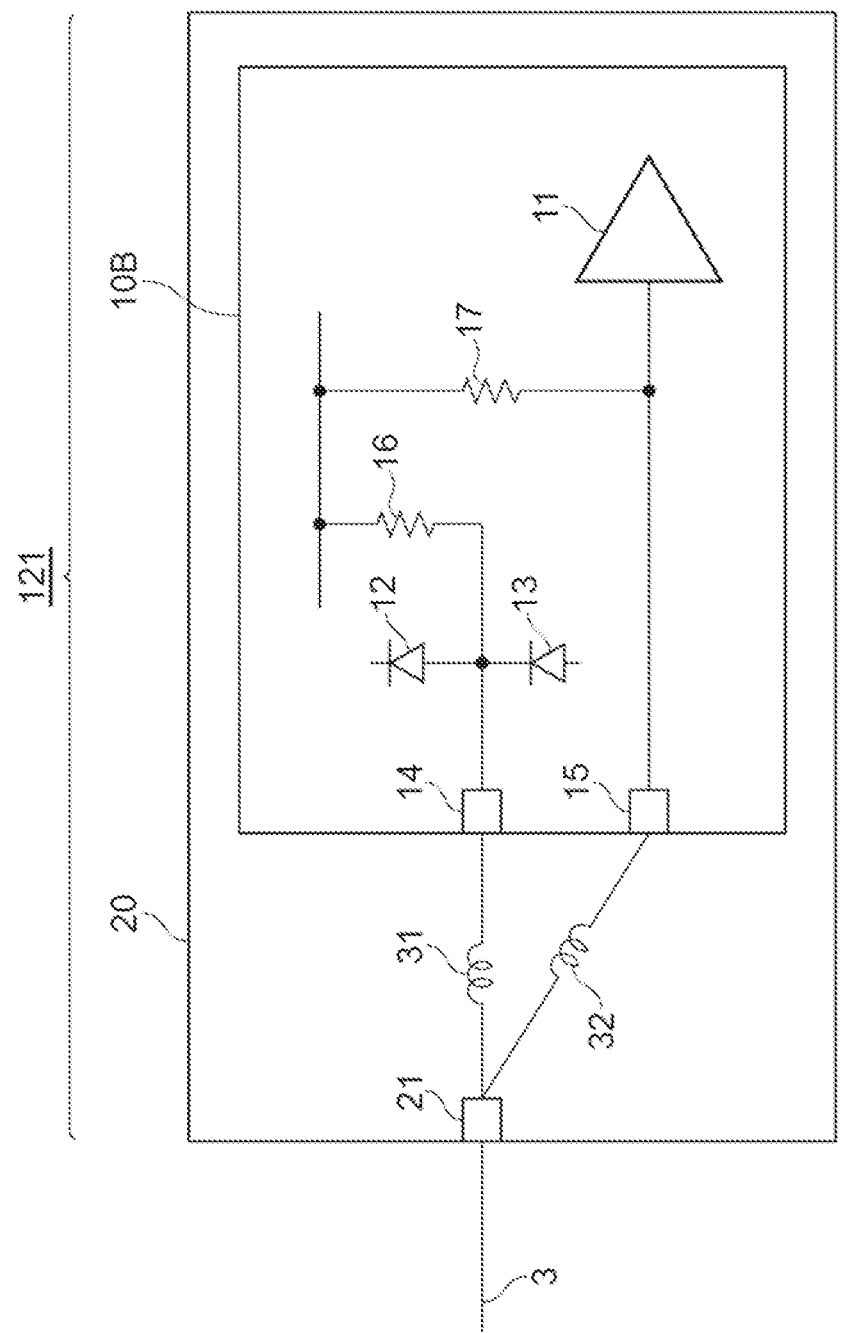
FIG. 8 is a diagram showing a configuration of a semiconductor device 121 of a second embodiment.

FIG. 8 is a diagram showing a configuration of a semiconductor device 121 of a second embodiment. The semiconductor device 121 includes a semiconductor chip 10B and a package 20, and receives a signal transmitted through the signal transmission line 3. When compared with the semiconductor chip 10A in the first embodiment, the semiconductor chip 10B in the second embodiment is different in that it further includes a second resistor 17. The second resistor 17 is provided between the reference potential supply terminal for supplying a power supply potential and the second pad 15.

Figure 9:
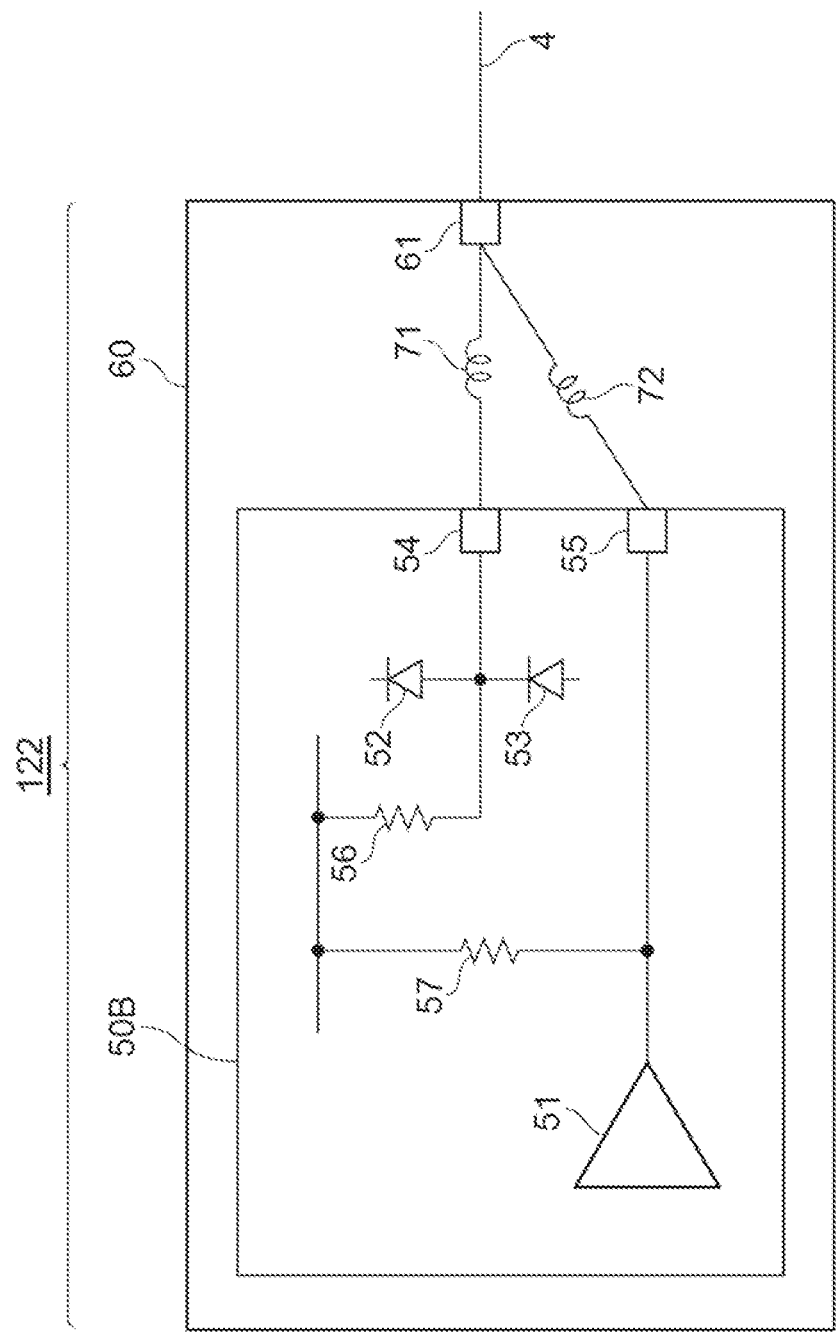
FIG. 9 is a diagram showing a configuration of a semiconductor device 122 of the second embodiment.

FIG. 9 is a diagram showing a configuration of a semiconductor device 122 of the second embodiment. The semiconductor device 122 includes a semiconductor chip 50B and a package 60, and transmits a signal to the signal transmission line 4. When compared with the semiconductor chip 50A in the first embodiment, the semiconductor chip 50B in the second embodiment is different in that it further includes a second resistor 57. The second resistor 57 is provided between the reference potential supply terminal for supplying a power supply potential and the second pad 55.

In the configuration of the second embodiment (FIGS. 8 and 9), when the resistance value of the first resistor is R1, and the resistance value of the second resistor is R2, and the characteristic impedance of the signal transmission line is Z0, the influence of the parasitic inductance of the bonding wire can be reduced by making the following Equation (5) established (or make it approximately established). In the second embodiment, since both R1 and R2 can be set to values larger than Z0, when compared with the first embodiment (FIGS. 5 and 6). C can be made smaller, and even when L is a large value, the above-described Equation (4) can be easily established (or approximately established). In the embodiment of FIG. 8, the left side of Equation (5) is a parallel combined resistance value R between the input terminal 21 and the reference potential supply terminal for supplying a power supply potential. In the embodiment of FIG. 9, the left side of Equation (5) is a parallel combined resistance value R between the output terminal 61 and the reference potential supply terminal for supplying a power supply potential. In order to approximately establish Equation (5), for example, R×90%≤Z0≤R×110% may be satisfied, and this principle can be applied to other embodiments.

Equation (5)

$$\frac{1}{\frac{1}{R1}+\frac{1}{R2}} = Z0 \quad (5)$$

Third Embodiment

Figure 10:
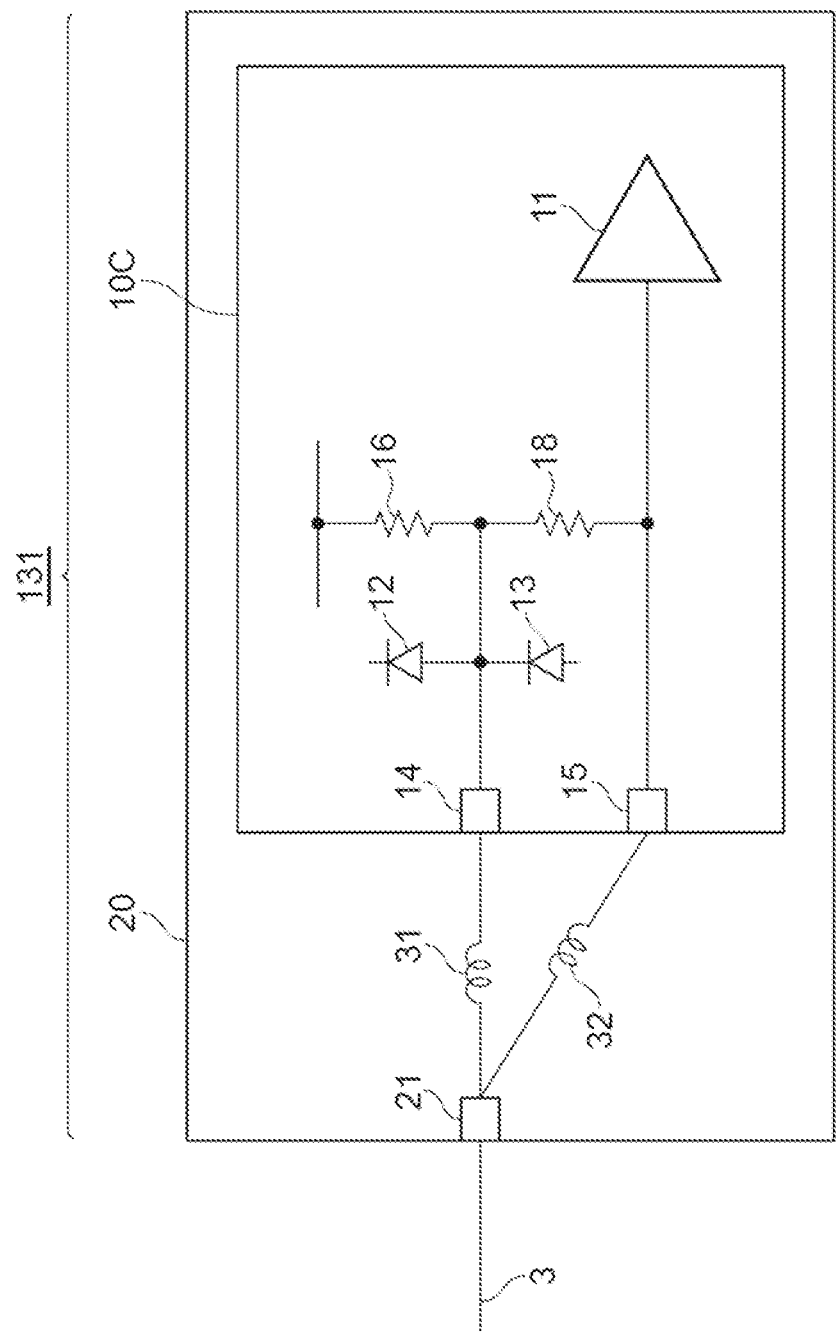
FIG. 10 is a diagram showing a configuration of a semiconductor device 131 of a third embodiment.

FIG. 10 is a diagram showing a configuration of a semiconductor device 131 of a third embodiment. The semiconductor device 131 includes a semiconductor chip 10C and a package 20, and receives a signal transmitted through the signal transmission line 3. When compared with the semiconductor chip 10A in the first embodiment, the semiconductor chip 10C in the third embodiment is different in that it further includes a third resistor 18. The third resistor 18 is provided between the first pad 14 and the second pad 15.

Figure 11:
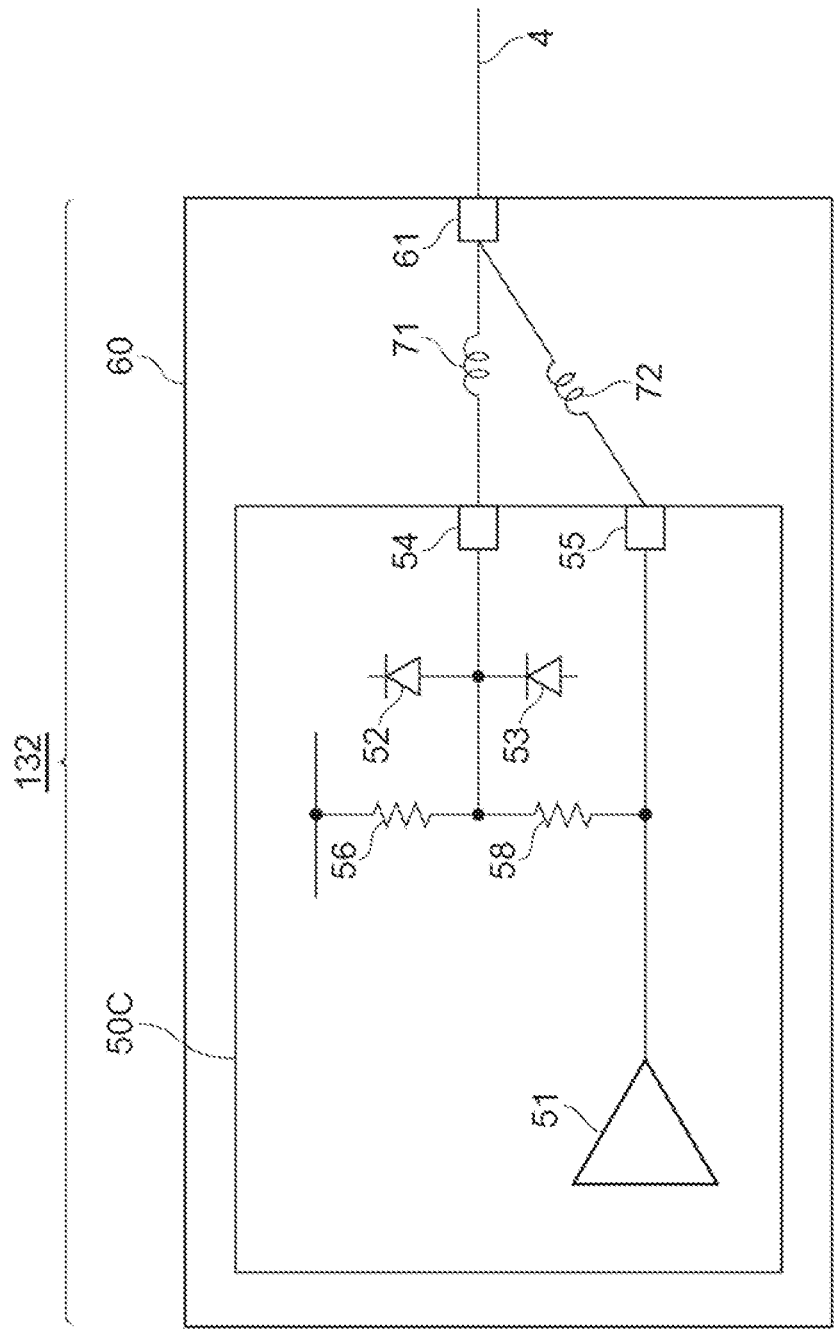
FIG. 11 is a diagram showing a configuration of a semiconductor device 132 of the third embodiment.

FIG. 11 is a diagram showing a configuration of a semiconductor device 132 of the third embodiment. The semiconductor device 132 includes a semiconductor chip 50C and a package 60, and transmits a signal to the signal transmission line 4. When compared with the semiconductor chip 50A in the first embodiment, the semiconductor chip 50C in the third embodiment is different in that it further includes a third resistor 58. The third resistor 58 is provided between the first pad 54 and the second pad 55.

In the configuration of the third embodiment (FIGS. 10 and 11), in addition to the first resistor provided between the reference potential supply terminal for supplying a power supply potential and the first pad, a third resistor is provided between the first pad and the second pad. Even when the frequency characteristic becomes too steep due to the influence of the parasitic inductance of the bonding wire, the frequency characteristic can be adjusted by providing the third resistor.

In the configuration of the third embodiment (FIGS. 10 and 11), assuming that the resistance value of the third resistor is R3, a combined impedance Z is represented by the following Equation (6).

Equation (6)

$$Z = \frac{1}{\frac{1}{R1}+sC} + \frac{1}{\frac{1}{sL+R3}+\frac{1}{sL}} = \frac{R}{1+sCR}+sL\frac{1+\frac{sL}{R3}}{1+2\frac{sL}{R3}} \quad (6)$$

When Equation (6) is represented by the angular frequency ω and a value of ωL/R3 is sufficiently smaller than 1, and a value of ωRC is sufficiently smaller than 1, Equation (6) can be approximated by the following Equation (7).

Equation (7)

$$Z = \frac{R}{1+j\omega CR}+j\omega L\frac{1+j\omega\frac{L}{R3}}{1+j\omega\frac{2L}{R3}} \quad (7)$$

$$\equiv R\left\{1+\omega^2\frac{L}{R}\frac{L}{R3}+j\omega\left[\frac{L}{R}-CR\right]\right\}$$

An absolute value of the combined impedance Z is represented by the following Equation (8).

Equation (8)

$$|Z| \equiv R\sqrt{\left(1+\omega^2\frac{L}{R}\frac{L}{R3}\right)^2+\omega^2\left(\frac{L}{R}-CR\right)^2} \quad (8)$$

$$\equiv R\left\{1+\frac{1}{\left(1+\omega^2\frac{L}{R}\frac{L}{R3}\right)^2}\frac{1}{2}\omega^2\left(\frac{L}{R}-CR\right)^2\right\}$$

On the other hand, when the above-described Equation (4) in the first embodiment is modified, it becomes the following Equation (9).

Equation (9)

$$|Z| \equiv R\left\{1+\frac{1}{2}\omega^2\left(\frac{L}{R}-CR\right)^2\right\} \quad (9)$$

When Comparing Equations (8) and (9), they are different from each other in the presence or absence of a factor represented by the following Equation (10). Since a value of Equation (10) is smaller than 1, the influence of the parasitic impedance of the bonding wire can be easily reduced in the third embodiment as compared with the first embodiment.

Equation (10)

$$\frac{1}{\left(1+\frac{1}{2}\omega^2\frac{L}{R}\frac{L}{R3}\right)^2} \quad (10)$$

Fourth Embodiment

Figure 12:
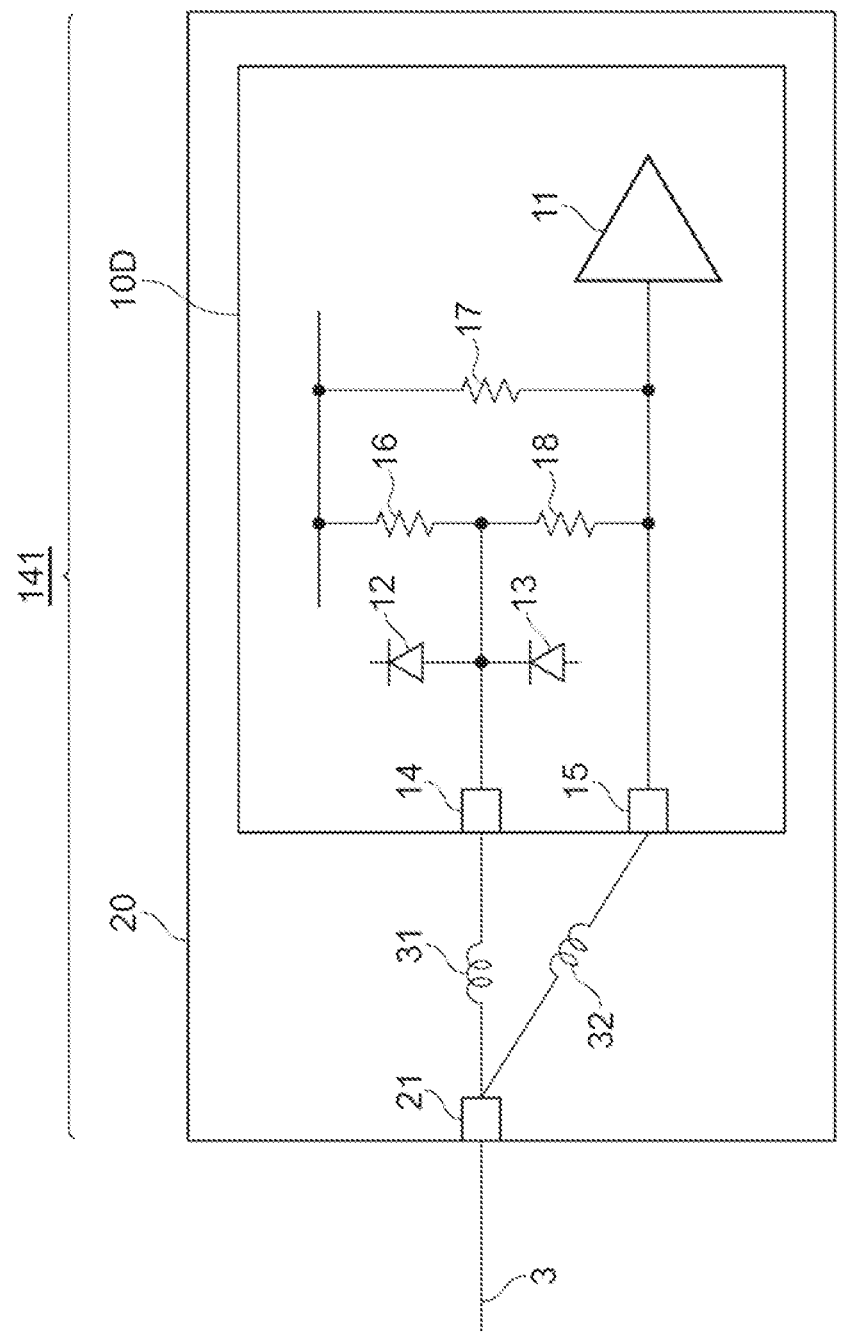
FIG. 12 is a diagram showing a configuration of a semiconductor device 141 of a fourth embodiment.

FIG. 12 is a diagram showing a configuration of a semiconductor device 141 of a fourth embodiment. The semiconductor device 141 includes a semiconductor chip 10D and a package 20, and receives a signal transmitted through the signal transmission line 3. When compared with the semiconductor chip 10B in the second embodiment, the semiconductor chip 10D in the fourth embodiment is different in that it further includes a third resistor 18. The third resistor 18 is provided between the first pad 14 and the second pad 15.

Figure 13:
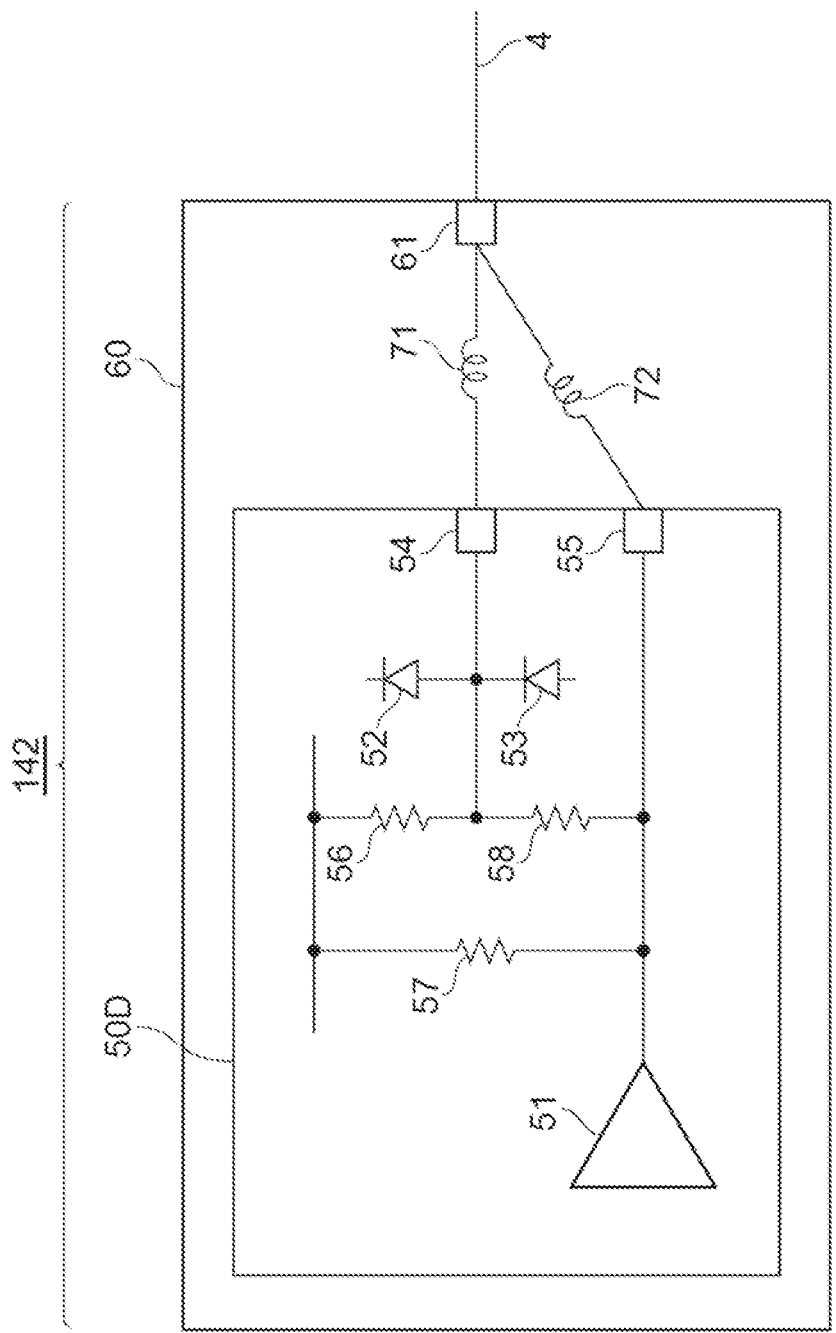
FIG. 13 is a diagram showing a configuration of a semiconductor device 142 of the fourth embodiment.

FIG. 13 is a diagram showing a configuration of a semiconductor device 142 of the fourth embodiment. The semiconductor device 142 includes a semiconductor chip 50D and a package 60, and transmits a signal to the signal transmission line 4. When compared with the semiconductor chip 50B in the second embodiment, the semiconductor chip 50D in the fourth embodiment is different in that it further includes a third resistor 58. The third resistor 58 is provided between the first pad 54 and the second pad 55.

In the configuration of the fourth embodiment (FIGS. 12 and 13), operational effects in each of the configurations of the second embodiment (FIGS. 8 and 9) and the third embodiment (FIGS. 10 and 11) can be obtained.

Fifth Embodiment

Figure 14:
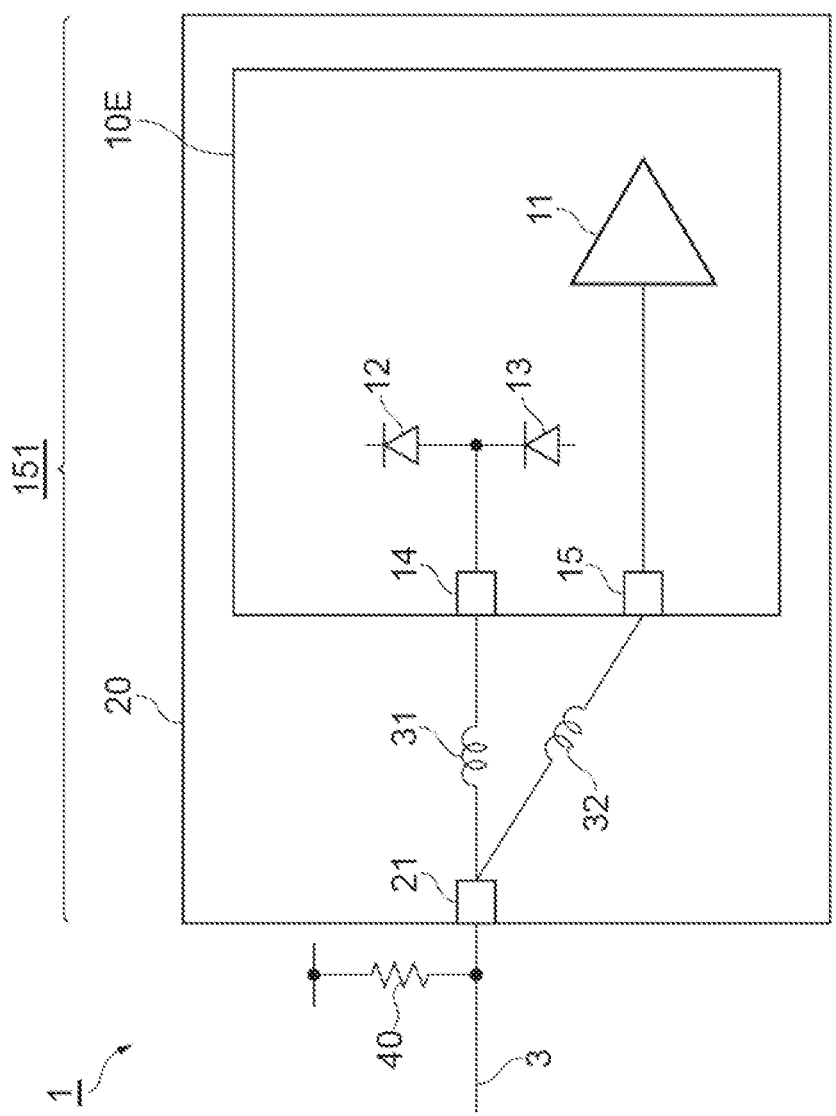
FIG. 14 is a diagram showing a configuration of a receiver 1 including a semiconductor device 151 and a fourth resistor 40 of a fifth embodiment.

FIG. 14 is a diagram showing a configuration of a receiver 1 including a semiconductor device 151 and a fourth resistor 40 according to a fifth embodiment. The semiconductor device 151 includes a semiconductor chip 10E and a package 20, and receives a signal transmitted through the signal transmission line 3. When compared with the semiconductor chip 10A in the first embodiment, the semiconductor chip 10E in the fifth embodiment is different in that it does not include the first resistor 16. The receiver 1 includes the fourth resistor 40 provided between the reference potential supply terminal for supplying a power supply potential and the terminal 21, instead of the first resistor 16 in the semiconductor chip.

Figure 15:
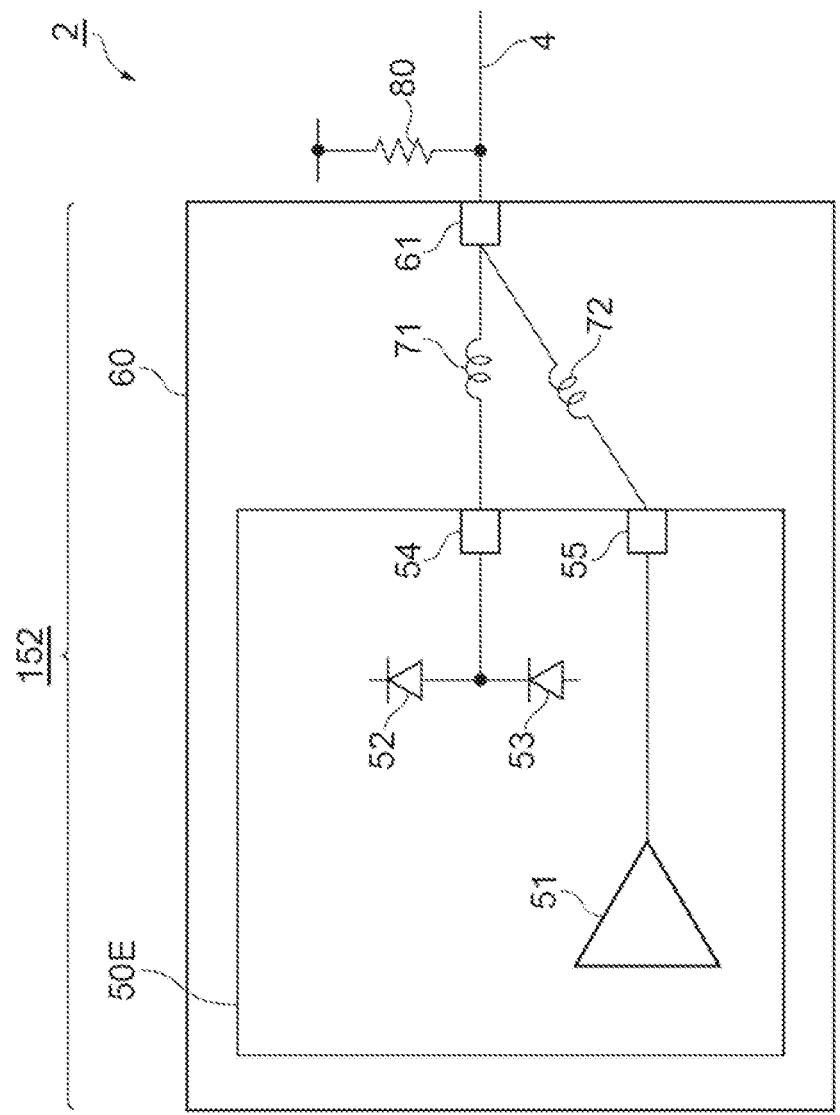
FIG. 15 is a diagram showing a configuration of a transmitter 2 including a semiconductor device 152 and a fifth resistor 80 of the fifth embodiment.

FIG. 15 is a diagram showing a configuration of a transmitter 2 including a semiconductor device 152 and a fifth resistor 80 of the fifth embodiment. The semiconductor device 152 includes a semiconductor chip 50E and a package 60, and transmits a signal to the signal transmission line 4. When compared with the semiconductor chip 50A in cite first embodiment, the semiconductor chip 50E in the fifth embodiment is different in that it does not include the first resistor 56. The transmitter 2 includes the fifth resistor 80 provided between the reference potential supply terminal for supplying a power supply potential and the terminal 61, instead of the first resistor 56 in the semiconductor chip.

In the configuration of the fifth embodiment (FIGS. 14 and 15), the operational effects in the configuration of the first embodiment (FIGS. 5 and 6) can be obtained. Further, since the resistors 40 and 80 as terminating resistors are provided outside the semiconductor chip, it can also be applied to low voltage differential signaling (LVDS), and the resistors 40 and 80 having suitable resistance values can be selected and used.

Figure 16:
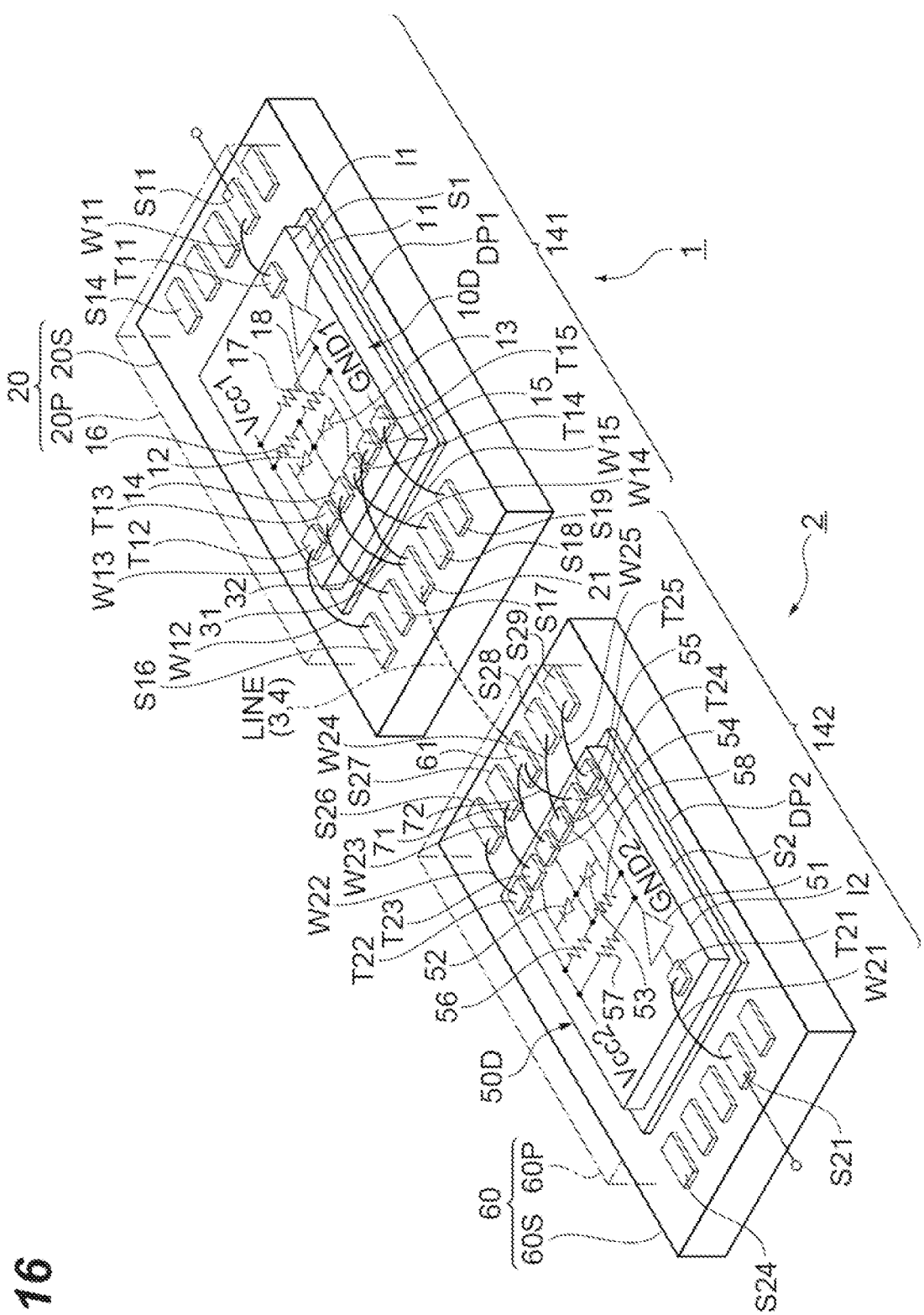
FIG. 16 is a diagram showing a transmission and reception system including the receiver 1 and the transmitter 2.

FIG. 16 is a diagram showing a transmission and reception system including the receiver 1 and the transmitter 2.

The receiver 1 is the semiconductor device 141 shown in FIG. 12, and the transmitter 2 is the semiconductor device 142 shown in FIG. 13.

(Receiver)

The semiconductor chip 10D constituting a main part of the receiver 1 includes a semiconductor substrate S1 as a semiconductor chip main body, and a surface of the semiconductor substrate S1 made of Si or the like is covered with an insulating layer I1 made of $SiO_2$ or the like. A plurality of conductive pads, a power supply line Vcc1 (a reference potential supply terminal), and a ground line GND1 are disposed on the insulating layer I1 of the semiconductor substrate S1. In the semiconductor substrate S1, a first ESD protection device 12 (a diode), a second ESD protection device 13 (a diode), a first resistor 16, a second resistor 17, and a third resistor 18 are formed. Each of these resistors may be formed on the insulating layer I1.

A cathode of the first ESD protection device 12 (the diode) is connected to a pad T13, and an anode thereof is connected to the pad 14. A cathode of the second ESD protection device 13 (die diode) is connected to the pad 14, and an anode thereof is connected to the pad 14. The pair of diodes constitute a clamp diode. The clamp diode is a pair of ESD protection devices and a pair of ESD protection diodes. The number of diodes may be two or more.

A first potential V1 for the power supply line Vcc1 is applied to a terminal S16, a second potential V2 for ESD is applied to a terminal S17, and a third potential V3 for ESD is applied to a terminal S18, and a fourth potential V4 for the ground line GND1 is applied to a terminal S19. The relationship between these potentials satisfies, for example, V1>V2>V3>V4, and an amplitude center potential of an input signal to an input terminal 21 can be set between the second potential V2 and the third potential V3.

The package 20 includes an insulating substrate 20S and an insulating layer 20P made of a resin material or the like. A die pad DP1 is disposed on the substrate 20S, and a semiconductor chip 10D is attached on the die pad DP1. The semiconductor chip 10D is covered with the insulating layer 20P. Terminals are disposed on the substrate 20S. An output terminal S11, a terminal S14, and the like are disposed on the output side (the right side) of the substrate 20S. The input terminal 21 and the like are disposed on the input side (the left side) of the substrate 20S. Since there are various types of connection modes between the pad and the terminal, the terminals not used in this example are also shown in the drawing.

A conductive pad T11 located on the output side of the semiconductor chip 10D constituting the receiver 1 is connected to the terminal S11 on the output side via a bonding wire W11. A conductive pad T12 connected to the power supply line Vcc1 on the semiconductor chip 10D is connected to a terminal S16 via a bonding wire W12. A conductive pad T13 located on the input side of the semiconductor chip 10D is connected to a terminal S17 via a bonding wire W13. A conductive pad 14 located on the input side of the semiconductor chip 10D is connected to a terminal 21 via a bonding wire 31. A conductive pad T14 located on the input side of the semiconductor chip 10D is connected to a terminal S18 via a bonding wire W14. A conductive pad 15 located on the input side of the semiconductor chip 10D is connected to the terminal 21 via a bonding wire 32. A conductive pad T15 connected to the ground line GND1 on the semiconductor chip 10D is connected to a terminal S19 via a bonding wire W15.

(Transmitter)

The semiconductor chip 50D constituting a main part of the transmitter 2 includes a semiconductor substrate S2 as a semiconductor chip main body, and a surface of the semiconductor substrate S2 made of Si or the like is covered with an insulating layer I2 made of $SiO_2$ or the like. A plurality of conductive pads, a power supply line Vcc2 (a reference potential supply terminal), and a ground line GND2 are disposed on the insulating layer I2 of the semiconductor substrate S2. In the semiconductor substrate S2, a first ESD protection device 52 (a diode), a second ESD protection device 53 (a diode), a first resistor 56, a second resistor 57, and a third resistor 58 are formed. Bach of the resistors may be formed on the insulating layer I2.

A cathode of the first ESD protection device 52 (the diode) is connected to a pad T23, and an anode thereof is connected to the pad 54. A cathode of the second ESD protection device 53 (the diode) is connected to the pad 54, and an anode thereof is connected to a pad T24. The pair of diodes constitute a clamp diode. The clamp diode is a pair of ESD protection devices and a pair of ESD protection diodes. The number of diodes may be two or more.

A first potential V1 for the power supply line Vcc2 is applied to a terminal S26, a second potential V2 for ESD is applied to a terminal S27, a third potential V3 for ESD is applied to a terminal S28, and a fourth potential V4 for the ground line GND2 is applied to a terminal S29. The relationship between the potentials satisfies, for example, V1>V2>V3>V4, and an amplitude center potential of an output signal output from an output terminal 61 can be set between the second potential V2 and the third potential V3.

The package 60 includes an insulating substrate 60S and an insulating layer 60P made of a resin material or the like. A die pad DP2 is disposed on the substrate 60S, and the semiconductor chip 50D is attached on the die pad DP2. The semiconductor chip 50D is covered with the insulating layer 60P. Terminals are disposed on the substrate 60S. The output terminal 61 and the like are disposed on the output side (the right side) of the substrate 60S. An input terminal S2I, a terminal S24, and the like are disposed on the input side (the left side) of the substrate 60S. Since there are various types of connection modes between the pad and the terminal, the terminals not used in this example are also shown in the drawing.

A conductive pad T21 located on the input side of the semiconductor chip 50D constituting the transmitter 2 is connected to the terminal S21 on the input side via a bonding wire W21. A conductive pad T22 connected to the power supply line Vcc2 on the semiconductor chip 50D is connected to a terminal S26 via a bonding wire W22. A conductive pad T23 located on the output side of the semiconductor chip 50D is connected to a terminal S27 via a bonding wire W23. A conductive pad 54 located on the output side of the semiconductor chip 50D is connected to a terminal 61 via a bonding wire 71. A conductive pad T24 located on the output side of the semiconductor chip 50D is connected to a terminal S28 via a bonding wire W24. A conductive pad 55 located on the output side of the semiconductor chip 50D is connected to the terminal 61 via a bonding wire 72. A conductive pad T25 connected to the ground line GND2 on the semiconductor chip 50D is connected to a terminal S29 via a bonding wire W25.

The terminal 61 of the transmitter 2 is connected to the terminal 21 of the receiver 1 via signal transmission lines LINE. The signal transmission lines LINE are the above-described signal transmission lines 3 and 4.

In FIG. 16, as in the above-described embodiments (the embodiment of FIG. 5, the embodiment of FIG. 6, the embodiment of FIG. 8, the embodiment of FIG. 9, the embodiment of FIG. 10, the embodiment of FIG. 11), the resistors corresponding to these drawings may be omitted. Further, in FIG. 16, it is also possible to add resistors corresponding to these drawings as in the above-described embodiments (the embodiment of FIG. 14 and the embodiment of FIG. 15).

As described above, a semiconductor device as the above-described receiver 1 includes the package 20 having the first terminal 21, the semiconductor chip 10D provided to the package and including the first pad 14 and the second pad 15, die pair of ESD protection devices 12 and 13 connected to the first pad 14, and the signal processing circuit 11 connected to the second pad 15, the first bonding wire 31 which connects the first terminal 21 to the first pad 14, the second bonding wire 32 which connects the first terminal 21 to the second pad 15, and the first resistor 16 or 40 directly or indirectly connected between a connection point between the pair of ESD protection devices 12 and 13 and the reference potential supply terminal Vcc1.

An example of the signal processing circuit 11 is an amplifier, and a signal output from the signal processing circuit 11 is output to the outside of the receiver 1 via the pad T11, the bonding wire W11, and the terminal S11.

A semiconductor device as the above-described transmitter 2 includes the package 60 having the first terminal 61, the semiconductor chip 50D provided to the package and including the first pad 54 and the second pad 55, the pair of ESD protection devices 52 and 53 connected to the first pad 54, and the signal processing circuit 51 connected to the second pad 55, the first bonding wire 71 which connects the first terminal 61 to the first pad 54, the second bonding wire 72 which connects the first terminal 61 to the second pad 55, and the first resistor 56 or 80 directly or indirectly connected between a connection point between the pair of ESD protection devices 52 and 53 and the reference potential supply terminal Vcc2.

An example of the signal processing circuit 51 is an amplifier, and a signal input from the outside to the transmitter 2 via the terminal S2I is input to the signal processing circuit 51 via the bonding wire W21 and the pad T21.

The semiconductor chips shown in FIGS. 5, 6, 8, 9, 10, 11, 12, 13 and 16 include the first resistor 16 or 56.

The semiconductor chips shown in FIGS. 8, 9, 12, 13 and 16 further include the second resistor 17 or 57 connected between the second pad 15 or 55 and the reference potential supply terminal Vcc1 or Vcc2.

The semiconductor chips shown in FIGS. 10, 11, 12, 13 and 16 further include the third resistor 18 or 58 provided between the first pad 14 or 54 and the second pad 15 or 55.

The external fourth or fifth resistor (40 or 80: the first resistor) shown in FIGS. 14 and 15 is provided outside the semiconductor chip. In this case, the connection point between the ESD protection devices is indirectly connected to the reference potential supply terminal (the power supply potential) via the first bonding wire 31 or 71 and the external resistor 40 or 80 thereof. In the description, unless otherwise specified, the connection of circuit elements means a direct electrical connection, but when the operational effects do not change substantially, other circuit devices may be interposed between the circuit elements.

In the semiconductor devices of FIGS. 5, 8, 10, 12, 14, and 16, when the second pad 15 is connected to the signal input terminal of the signal processing circuit 11, the semiconductor device constitutes a receiver. Further, in the semiconductor devices of FIGS. 6, 9, 11, 13, 13, 15, and 16, when the second pad 55 is connected to the signal output terminal of the signal processing circuit 51, the semiconductor device constitutes a transmitter. Furthermore, even when the semiconductor device does not have the ESC) protection device, the influence of the parasitic inductance of the bonding wire can be reduced, and the performance of the signal processing can be improved, but when the semiconductor device includes the ESD protection device, a malfunction can be curbed, and the performance of the signal processing can be further improved.

What is claimed is:

1. A semiconductor device comprising:
    a semiconductor chip including:
        a signal processing circuit;
        a plurality of pads; and
        a first resistor,
    a package provided with the semiconductor chip, the package including terminals for inputting a signal from or outputting a signal to outside,
    wherein there is no short-circuiting between a first pad and a second pad of the plurality of pads, the first resistor is provided between the first pad and a reference potential supply terminal, and the second pad is connected to a signal input terminal or a signal output terminal of the signal processing circuit, and wherein a specific terminal among the terminals of the package is connected to the first pad by a first bonding wire and is connected to the second pad by a second bonding wire.

2. The semiconductor device according to claim 1, wherein the semiconductor chip includes a second resistor provided between die second pad and the reference potential supply terminal.

3. The semiconductor device according to claim 1, wherein the semiconductor chip includes a third resistor provided between the first pad and the second pad.

4. A semiconductor device comprising:
a semiconductor chip including:
a signal processing circuit; and
a plurality of pads,
a package provided with the semiconductor chip, the package including terminals for inputting a signal from or outputting a signal to outside,
wherein there is no short-circuiting between a first pad and a second pad of the plurality of pads, and the second pad is connected to a signal input terminal of the signal processing circuit, and
wherein a specific terminal among the terminals of the package is connected to the first pad by a first bonding wire and is connected to the second pad by a second bonding wire.

5. A receiver comprising;
the semiconductor device according to claim 4; and
a fourth resistor provided between the specific terminal of the package and a reference potential supply terminal.

6. A semiconductor device comprising:
a semiconductor chip including;
a signal processing circuit; and
a plurality of pads,
a package provided with the semiconductor chip, the package including terminals for inputting a signal from or outputting a signal to outside,
wherein there is no short-circuiting between a first pad and a second pad of the plurality of pads, and the second pad is connected to a signal output terminals of the signal processing circuit, and
wherein a specific terminal among the terminals of the package is connected to the first pad by a first bonding wire and is connected to the second pad by a second bonding wire.

7. A transmitter comprising:
the semiconductor device according to claim 6; and
a fifth resistor provided between the specific terminal of the package and a reference potential supply terminal.

8. The semiconductor device according to claim 1, wherein the semiconductor chip has an electrostatic discharge (ESD) protection device connected to the first pad.

9. A semiconductor device comprising:
a package including a first terminal;
a semiconductor chip provided to the package, including:
first and second pads;
a pair of electrostatic discharge (ESD) protection devices connected to the first pad: and
a signal processing circuit connected to the second pad:
a first bonding wire connected between the first terminal and the first pad;
a second bonding wire connected between the first terminal and the second pad; and
a first resistor connected directly or indirectly between a connection point between the pair of the electrostatic discharge protection devices and a reference potential supply terminal.

10. The semiconductor device according to claim 9, wherein the semiconductor chip includes the first resistor.

11. The semiconductor device according to claim 10, wherein the semiconductor chip further includes a second resistor connected between the second pad and the reference potential supply terminal.

12. The semiconductor device according to claim 11, wherein the semiconductor chip further includes a third resistor provided between the first pad and the second pad.

13. The semiconductor device according to claim 9, wherein the first resistor is provided outside the semiconductor chip.

14. The semiconductor device according to claim 9, wherein the signal processing circuit is an amplifier.

15. A receiver comprising the semiconductor device according to claim 9,
wherein the second pad is connected to a signal input terminal of the signal processing circuit.

16. A transmitter comprising the semiconductor device according to claim 9,
wherein the second pad is connected to a signal output terminal of the signal processing circuit.

* * * * *